(12) United States Patent
Hahmann et al.

(10) Patent No.: US 6,635,395 B2
(45) Date of Patent: Oct. 21, 2003

(54) METHOD FOR EXPOSING A LAYOUT COMPRISING MULTIPLE LAYERS ON A WAFER

(75) Inventors: Peter Hahmann, Jena-Drackendorf (DE); Eckart Bergmann, Jena (DE)

(73) Assignee: Leica Microsystems Lithography GmbH, Jena (DE)

( * ) Notice: Subject to any disclaimer, the term of this patent is extended or adjusted under 35 U.S.C. 154(b) by 135 days.

(21) Appl. No.: 09/927,238

(22) Filed: Aug. 13, 2001

(65) Prior Publication Data

US 2002/0039828 A1 Apr. 4, 2002

Related U.S. Application Data

(60) Provisional application No. 60/224,979, filed on Aug. 14, 2000.

(51) Int. Cl.$^7$ .............................. G03F 9/00; G03C 5/00
(52) U.S. Cl. ........................ 430/22; 430/30; 430/296; 430/312; 430/328; 430/942
(58) Field of Search .................. 430/22, 296, 312, 430/328, 942, 30

(56) References Cited

U.S. PATENT DOCUMENTS 6,337,163 B1 * 1/2002 Sato .......................... 430/312

OTHER PUBLICATIONS

Chiou et al., "Evaluation of Fine Pattern Definition with Electron–Beam Direct Writing Lithography", Proc. Of SPIE, vol. 3997, Emerging Lithographic Technologies IV, ed. E. Dobisz (Mar. 2000), pp. 646–657.

* cited by examiner

Primary Examiner—Christopher G. Young
(74) Attorney, Agent, or Firm—Foley & Lardner

(57) ABSTRACT

The invention refers to a method for exposing a layout comprising multiple layers on a wafer, in which at least one layer is exposed photolithographically and subsequently at least one further layer is exposed with an electron beam, and the wafer is to be aligned in defined fashion with respect to the electron beam exposure system in terms of the previously photolithographically exposed layer.

It is provided according to the present invention that before electron beam exposure begins, an alignment of the wafer (global alignment) is performed on the basis of structural features that were previously generated on the wafer by photolithographic exposure.

For example, the wafer is first positioned coarsely in such a way that a surface area having selected structural features is located in the deflection region of the electron beam. That surface area is then scanned in spot fashion with the electron beam, and from the intensities of the radiation backscattered from the individual spots, a raster image is obtained and is compared to a raster image (template) of the same surface area with the wafer in the reference position. From the deviation, positioning instructions are generated to change the position of the wafer so as to bring the actual position closer to the reference position.

9 Claims, 3 Drawing Sheets

METHOD FOR EXPOSING A LAYOUT COMPRISING MULTIPLE LAYERS ON A WAFER

CROSS REFERENCE TO RELATED APPLICATIONS

This invention claims priority of the U.S. provisional patent application No. 60/224,979 filed Aug. 14, 2000 which is incorporated by reference herein.

FIELD OF THE INVENTION

The invention refers to a method for exposing a layout comprising multiple layers on a wafer, in which at least one layer is exposed photolithographically and subsequently at least one further layer is exposed with an electron beam, and the wafer is to be aligned in defined fashion with respect to the electron beam exposure system in terms of the previously photolithographically exposed layer.

BACKGROUND OF THE INVENTION

Lithographic methods in the manufacture of wafers often require successive exposure of multiple layers located one above another or areas located next to one another. It is important in this context that the successively exposed layers be positioned exactly with respect to one another, and that the areas located next to one another adjoin one another in precisely fitting fashion. Alignment marks are usually provided on the wafers for this purpose.

Both photolithographic methods and electron beam lithographic methods are used to expose wafers. Electron beam lithographic methods are characterized by higher resolution than the photolithographic methods. The production rates of steppers that operate on the photolithographic principle cannot, however, be achieved with conventional electron beam writing machines.

If high resolution and high productivity are required simultaneously, so-called "mix and match" exposure systems offer a way out in many cases. This means that steppers perform most of the lithography and expose almost all the layers of a layout. Electron beam lithography is employed only for layers with a high resolution. Either critical layers (gate layers) with a low packing density are exposed in their entirety, or those parts of a layout that require high resolution are filtered out (intra-level mix and match), and only they are delineated by electron beam lithography. In both cases, measurement of the alignment marks is of particular importance.

These alignment marks are, however, usually relatively small, so that they cannot readily be located. In practice, in fact, several steps are necessary to do so. In one known method, after a coarse alignment of the wafer, for example by orientation at its geometrical edges, an intermediate step using first marks (hereinafter also called "global alignment marks") is performed before the actual fine alignment is accomplished based on the alignment marks. One of the first important steps in the course of an exposure method is therefore global alignment, i.e. orienting the wafer using the first marks. Their size depends on the accuracy achievable during coarse alignment. First marks with an extension of typically 0.5 mm to 1 mm are usually used as search structures for global alignment, to allow the much finer alignment marks to be found later on.

In practice, for this purpose the position of at least one first mark is determined in the intermediate step. The position of the alignment marks can then be better determined with the aid of a coordinate transformation, so that they can be found in a small search field and, for the actual alignment of an image field of a chip on the wafer, aligned with respect to the particular lithography device.

Marks in the form of crosses with an extension of 1 to 2 mm are often used in electron beam lithography as global alignment marks. The evaluation algorithms usually require that the crosses be located in an undisturbed environment, i.e. that no other marks or similar structures be located in the immediate vicinity of the crosses, since otherwise the evaluation algorithm is disrupted.

To find these marks, in the known methods scans are first performed in a first direction with the electron beam. For this purpose, the electrons back-scattered from the wafer are sensed. An evaluation algorithm determines whether the mark was encountered in the course of the respective scanning operation. If so, its position is determined. An analogous procedure is then used in a second direction, thereby ultimately yielding the position of the mark.

The complete global alignment process measures the positions of multiple first marks and calculates the necessary transformations for a relative motion between the wafer and the lithography system, for example of coordinates of a stage on which the wafer is placed in terms of translation, rotation, and scaling, in order to find the alignment marks.

SUMMARY OF THE INVENTION

Proceeding therefrom, it is the object of the invention to improve a method of the kind cited initially in such a way that alignment of the wafers is simplified, and a higher throughput of wafer exposures per unit time is thereby attainable.

This object is achieved in that before electron beam exposure begins, an alignment of the wafer (global alignment) with respect to the electron beam exposure system is performed on the basis of structural features from the layer that was previously exposed photolithographically.

As a result, the marks that in the existing art needed to be provided on the wafer specifically for the electron beam exposure are no longer necessary. In other words, the method according to the present invention is advantageously no longer tied to special mark geometries; instead, global alignment can be based on a wide variety of structural features that can be selected almost at random from a layer that has already been exposed. The wafer can thus be aligned on any desired structure on the wafer in the electron beam exposure system, and the wafer does not require any separate structures that serve only for alignment in the electron beam exposure system.

In addition, advantageously, it is possible to use for alignment not only selected structural features from another layer, but also marks that originally were applied onto the wafer by no means specifically for electron beam exposure. Whereas different mark geometries hitherto had to be used for photolithographic methods and electron beam lithography methods, in this particular application of the method according to the present invention it is now possible to use common global alignment marks for alignment for both exposure methods.

In addition, it is possible to use the devices usually present in any case in the context of electron beam lithography or so-called mix and match lithography. This applies in particular to the deflection device for the electron beam, the devices for detecting backscattered electrons and for analog-digital conversion of the signal curves sensed in that context, and the devices for storing and processing data.

In a preferred embodiment of the invention, provision is made for first positioning the wafer coarsely with respect to the electron beam exposure system in such a way that a surface area of the previously photolithographically exposed layer that contains the selected structural features is located in the deflection region of the electron beam; then scanning the surface area in the X and Y direction in spot fashion with the electron beam, detecting the radiation backscattered from the individual spots, and obtaining from the intensities of the radiation backscattered from the individual spots an actual data set that corresponds to a raster image of that surface area with the wafer in the actual position; comparing the actual data set to a stored reference data set that corresponds to the raster image (template) of the same surface area with the wafer in the reference position; deriving from the deviation between the two data sets information as to the deviation between the actual position and the reference position; on the basis of that information causing a positional change of the wafer in order to bring the actual position closer to the reference position; then once again obtaining an actual data set and comparing it to the reference data set; and repeating the obtaining of an actual data set and the comparison with the reference data set, as applicable, until no further deviation is ascertained.

It is thereby possible to perform compensation for a positional deviation based on determination of the position of the selected structural features, so that the method according to the present invention can easily be used for automatic alignment of a wafer.

The signal curves obtained during spot scanning of the surface area are preferably digitized. The raster image is then also stored in digital form, thereby making possible easy storage and further processing.

As already explained above, the method according to the present invention is not limited to the use of special marks or structures as the basis for alignment. In an advantageous embodiment of the invention, it is thus possible to obtain the reference data set by means of a wafer that has already been exposed, the wafer and the electron beam exposure system first being displaced relative to one another until the selected structural features are located in the reference position, and a data set corresponding to the raster image of the surface area having those structural features then being acquired and stored. It is thereby possible, in principle, to use any desired characteristic structural features as recognition patterns. An electron beam exposure system in which a software program operating according to the method is implemented can thus be utilized very flexibly, allowing a wide variety of structural features to be selected as global alignment marks.

As an alternative to this, the reference data set can also be taken from electronically available structure data of the layer that is to be exposed photolithographically, and stored as the recognition pattern. It is conceivable, for example, to generate the corresponding geometry with a graphics program and to translate it into the format of the raster image.

It is also possible, however, to continue to use as the characteristic structural features, for example, the marks hitherto used for alignment in an electron beam device or even other geometric structures specially applied onto the wafers for that purpose.

Particularly advantageous, however, is the utilization according to the present invention of a characteristic structure area from a previously exposed layer, since in this case the application of special marks can be completely dispensed with. "Characteristic" means in this context that at least the region in the immediate vicinity of the structure area is free of similar structures.

The structure area examined for determining the position of the wafer should preferably have a size of up to 2000 $\mu$m×2000 $\mu$m. Referred to an area of this kind, scanning should be accomplished with between 20×20 and 1000× 1000 spots.

In a further advantageous embodiment, during raster scanning of the surface area to acquire the raster image with the electron beam, a spot chain is applied onto the substrate. In this context, the step size of the electron beam is in the range from 20 nm to 5 $\mu$m. The raster images obtained by way of the backscattered electrons ensure on the one hand a sufficient data volume for finding the selected structural features in the raster image using image data processing methods, and on the other hand a relatively short calculation time so that the structure being sought can be located quickly. Times of less than 60 seconds per raster image for finding and determining any positional deviation are possible.

During raster scanning, the surface area can also be divided into micro-fields that are scanned individually and assembled into an overall image. The division is preferably made into micro-fields having a maximum size of 60×60 spots each. In the context of storage of the image data in digital form, this is possible without major problems. Advantages in terms of image acquisition are thereby obtained, in particular in the context of hierarchically structured two-channel electron beam deflection systems, since partial images corresponding to the micro-fields can be obtained first using the lower-order sub-reflection system. This is favorable in terms of a high image acquisition rate.

A suitable hardware system is described in "Evaluation of Fine Pattern Definition with Electron-Beam Direct Writing Lithography," SPIE, 3997, pp. 646 ff, 2000. The content of this publication is incorporated into the present Application.

Global alignment using the method according to the present invention can be followed by fine alignment of the wafer on the basis of alignment marks present on the wafer. This involves the use of method steps that are already usual in the existing art. Compensation for a positional deviation with respect to the reference position can be integrated, by way of a corresponding correction of the approach motion for the search field, into the approach to a search field in which an alignment mark is suspected to be present. Fine alignment of the relevant image field or chip, and thus of the wafer, with respect to the electron beam lithography system is then performed on the basis of the alignment mark.

BRIEF DESCRIPTION OF THE DRAWINGS

The invention will be explained in more detail below with reference to a preferred exemplary embodiment in conjunction with drawings, in which.

DETAILED DESCRIPTION OF THE INVENTION

In order to align a wafer that is to be exposed in an apparatus for electron beam lithography, said wafer is first aligned coarsely with respect to the apparatus. Orientation is performed, for example, at the geometrical edges of the wafer. Positional accuracies achievable in this context are in the range of approximately 0.2 to 2 mm. For positioning the electron beam with an accuracy in the $\mu$m range, however, a more accurate positional association between the wafer and the electron beam system is necessary.

This is achieved, according to the present invention, with selected structural features previously exposed photolithographically on a different layer and with additional alignment marks. The selected structural features possess a greater extension than the alignment marks. Their essential purpose is to make it possible to find the alignment marks.

Figure 1:
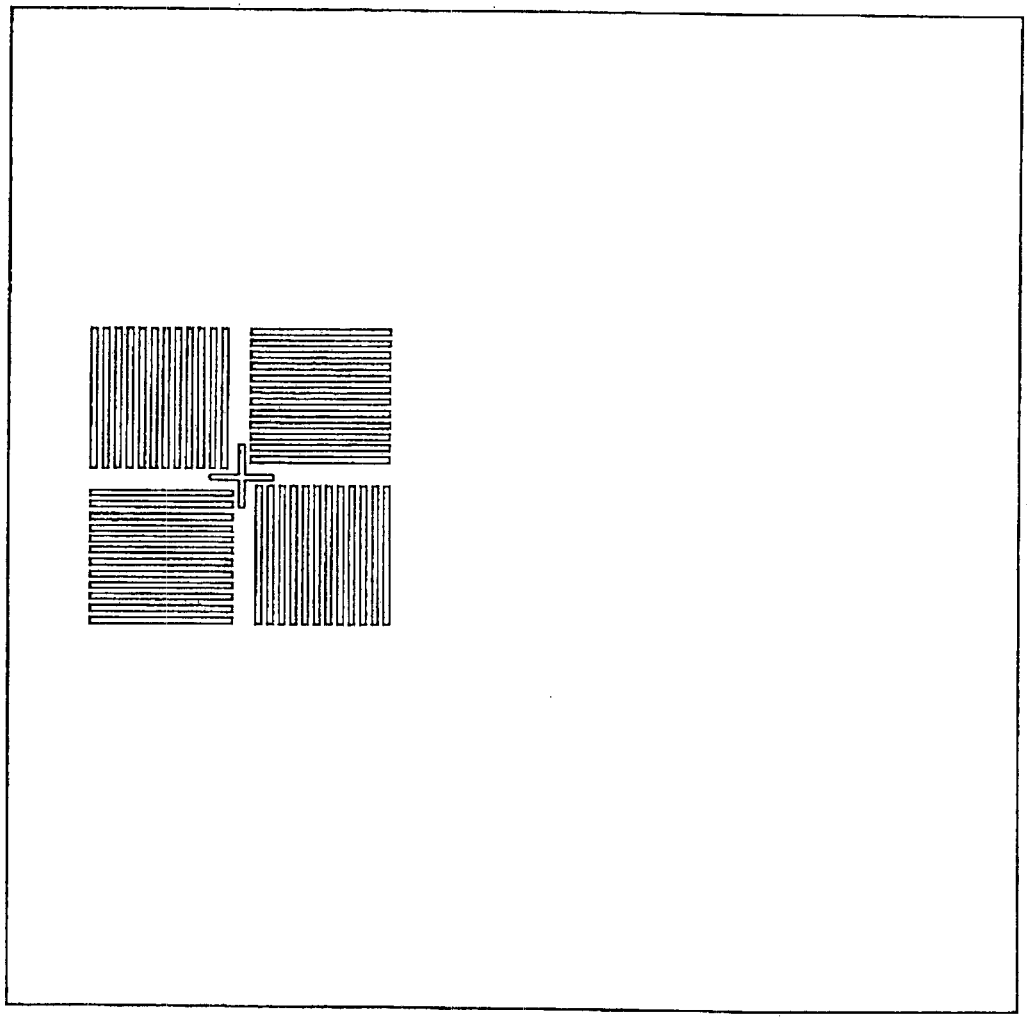
FIG. 1 shows characteristic structural features, selected for global alignment and differing from their environment, imaged using a detector for reflected or backscattered electrons, the light vertical lines indicating that the overall image was assembled from multiple strip-shaped micro-fields.
Figure 2:
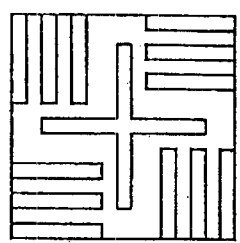
FIG. 2 shows a raster image based on a reference data set that is derived from the structural features shown in FIG. 1.

An example of selected structural features, here comprising four bar fields and a central cross, is depicted in FIG. 1. The example shows 150-nm intervals on $Si/SiO_2$. A central area of these structural features serves as the recognition pattern that is illustrated in FIG. 2. A corresponding raster image based on a reference data set is previously stored in a memory unit of the electron beam lithography system, and is used to determine the position of the wafer.

During image acquisition, the electron beam is guided over the wafer in raster fashion in the X and Y directions. The operation proceeds in steps, the electron beam being used to apply a spot chain onto the substrate with a uniform step size. The step size is in the range from 20 nm to 5 $\mu$m. During application of the spot chain, the reflected or backscattered electrons are sensed by means of one or more detectors. The signal curves thereby obtained are analyzed and stored as a digitized raster image.

To determine the position of the wafer, image data processing methods are then used to search the acquired raster image for a pattern corresponding to the previously stored recognition pattern. In order for such a pattern to be detected, it must be contained in the raster image but need not necessarily lie at its center. On the contrary, it is precisely the purpose of the image data processing software to recognize the presence of the pattern in the raster image and to ascertain its position.

When a pattern is found, its location with respect to a reference position must be determined. FIG. 1 shows an example of a raster image in which the pattern being sought is located to the left of the center of the raster image, it being assumed in this context that the reference position lies at the center of the image. The image data processing software recognizes the actual position of the pattern being sought, and delivers the corresponding coordinates to a positioning system with which the positional deviation from the reference position is compensated for by a relative motion between the wafer and the apparatus. This is preferably accomplished by corrective motions of a stage on which the wafer is placed for irradiation purposes. The corrective motions can be performed both in translation in two coordinate directions and rotationally.

Figure 4:
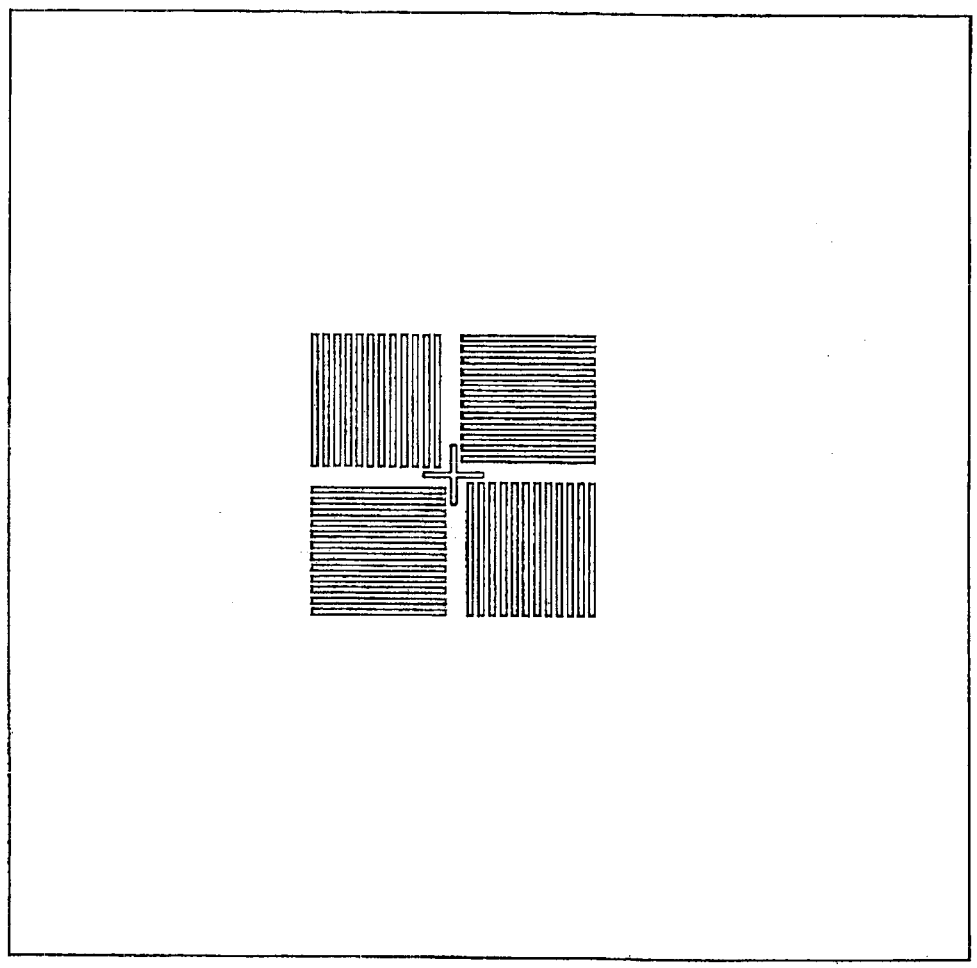
FIG. 4 shows the characteristic structural features of FIG. 1, imaged using a detector for backscattered or reflected electrons after a compensation for a positional deviation between the wafer and an electron beam apparatus with respect to a reference position, i.e. after an alignment.

FIG. 4 shows a check image following a compensation for the positional deviation, in which the pattern being sought (and therefore the first mark) is located at the center of the raster image, i.e. in what is assumed here to be the reference position. By determining the position of several surface areas with characteristic structural features, the deviation of the wafer from a reference position can be determined in several coordinates. For this purpose, raster images of the areas of the wafer in which the respective structural features are suspected to be located are generated in the manner referred to above, and the deviations with respect to the particular reference position are ascertained.

It is not absolutely necessary in this context for a compensation for the positional deviation to be performed immediately after it is ascertained. Instead, a relative motion in terms of translation and rotation can be ascertained from the detected positions of the structural features.

The position determination process, which is based on acquisition of a complete raster image each time, operates with a global alignment algorithm with image recognition based on a two-dimensional correlation. This algorithm is explained in further detail below. Special preselection methods serve to minimize calculation time. Depending on the number of image points, for example, the image acquisition time, including transfer time to a module computer (VMEAX) is approximately 5 to 20 seconds. Complete global alignment, comprising movement to a surface area having structural features, image acquisition, and calculation time, takes approximately 20 seconds per raster image. The resolution of the correlation method is at subpixel accuracy.

The invention is not limited to the method example described above. On the contrary, geometries other than those depicted in the Figures can also be used.

It is also possible to use global alignment marks originally provided for photolithographic steppers, which can be recognized in the manner described above using the electron beam lithography arrangement. This is advantageous in particular when the method explained above is used in a mix and match procedure in which photolithography and electron beam lithography are used alternatingly.

Instead of geometric structures placed separately on the wafer, it is also possible to use characteristic structures or structure areas already present on the wafer. A structure is "characteristic" if it does not occur more than once in a larger surrounding area that corresponds approximately to the search field.

In preparation for global alignment, a typical image detail, for example a marking applied onto the wafer or a characteristic structure area, is declared as the recognition pattern. There are several possibilities for doing so.

A first possibility is to "teach" the recognition pattern by means of a selected wafer. For this purpose the wafer and the apparatus are displaced relative to one another, with repeated acquisition of a raster image as applicable, until the selected structure area is located in the reference position, i.e. in this case at the center of the raster image. With the wafer in this position, a raster image is then acquired in the manner already described above, and it (or only a portion thereof) is stored as the recognition pattern. FIG. 2 shows one such portion of a raster image, comprising approximately one-fifth of the raster image. The edge lengths of the square recognition pattern depicted here are each 120 $\mu$m.

Figure 3:
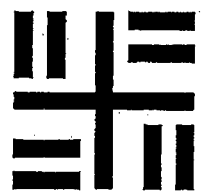
FIG. 3 shows a raster image based on a reference data set that was generated by means of a graphics program.

If the selected structural features or the recognition pattern are or is available in electronically stored form from the development phase of the layer in question, it is then also alternatively possible to generate a corresponding depiction with a graphics program, and to translate it into the format of the raster image. FIG. 3 shows an example of a graphic depiction of this kind, analogous to the recognition pattern depicted in FIG. 2.

With larger raster image formats, it is advantageous if the corresponding surface area on the wafer is broken down into micro-fields in the context of the search for structural features. These fields are then each scanned line by line in raster fashion with the deflection system of the electron beam. The positioning system of the electron beam lithography system can additionally be used to move between the micro-fields. Image acquisition with this field-wise procedure is rapid because the process of moving to the individual scan points is efficient.

Before an analysis of the image data is performed, the micro-fields are assembled into an overall image. The recognition pattern, or the structural features corresponding to it, is or are then searched for in this overall image.

Figure 6:
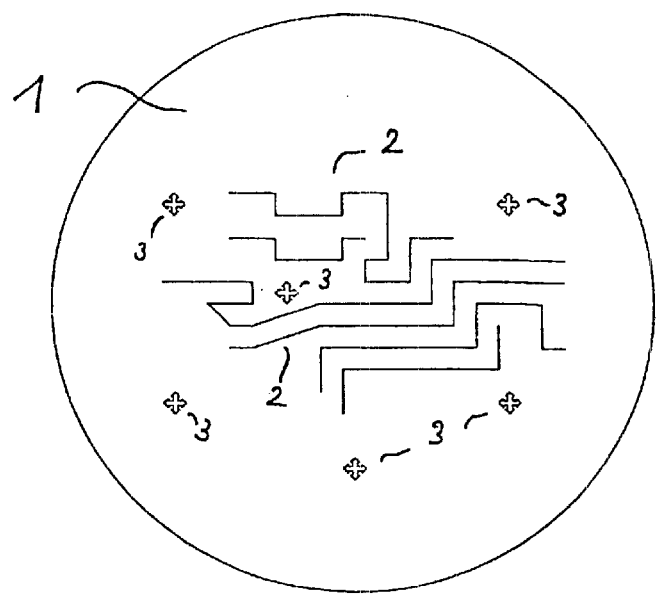
FIG. 6 shows a wafer having structure.

FIG. 6 schematically shows a wafer 1 having structures 2 that represent electronic circuits or mechanical structures. Also depicted are global alignment marks 3 that are necessary for the alignment of wafer 1 during photolithographic exposure. According to the present invention, structures 2, or characteristic structural features of structures 2, or also global alignment marks 3 present for photolithographic exposure, are used for the alignment of wafer 1 in the electron beam exposure system. It is therefore possible to dispense with the special global alignment marks (not depicted in FIG. 6) hitherto applied on wafer 1 that served exclusively the purpose of aligning the wafer in the context of electron beam lithographic exposure.

For further explanation, a concrete example of two-dimensional image evaluation will be provided below, based on a corresponding software program that is used in a ZBA 31 (k) electron beam exposure system of the company styled Leica Microsystems Lithography GmbH.

New functions for the two-dimensional acquisition and storage of backscattered electron images, and an algorithm for finding a respective salient structure (of the reference image) within a search image that is larger compared to that reference structure, were incorporated as part of an expansion of capabilities for global alignment on previously patterned wafers or masks within the CAL software of the ZBA 31 (k) electron beam exposure system. In this connection, the syntax of the global alignment description files (GDFs) was also further expanded.

The image acquisition measurement function (glkmes) can also be used to obtain any desired two-dimensional RE or alignment detector signals (2D sweeps). This function is automatically coupled to visualization of the image data obtained.

The available SCM functions also include the tafswp and oldmes functions, used principally to test the basic two-dimensional image acquisition procedures. These are only briefly documented here. For testing the image evaluation algorithm used within GDF_glocos, the two functions pctr_lcmp and pctr_test (also usable individually in the SCM) were enhanced.

General principles of two-dimensional image acquisition

The image acquisition function implemented in CAL is capable at present of storing two-dimensional square pixel images with a data volume of from 30*30 pixels to a maximum of 600*600 pixels (pctr_anz). The size of the image (pctr_dim) can be selected from 3*3 $\mu m^2$ to a maximum of 1700*1700 $\mu m^2$. The resulting step size must not exceed 5 $\mu m$, and the minimum step size is 20 nm; in other words, the parameters pctr_anz and pctr_dim cannot be combined arbitrarily (for example, with 200*200 measurement points (pctr_anz=200) the maximum size of the image can be only 1 mm (pctr_dim=1000); at 600*600 measurement points, the minimum image size is 12 $\mu m$). Image acquisition is always performed symmetrically with respect to the present stage position; i.e. the center of the image corresponds to the position of the undeflected electron beam at the particular stage position. The process of actually obtaining the readings is accomplished, like a one-dimensional sweep, using the signal channel (DSP SIC).

A spot chain is organized in the X direction at the requisite step size, and is repeated with the same step size in the negative Y direction until an overall square surface has been scanned with the microchannel. One pixel is stored for each spot. A maximum of 60*60 pixels per micro-field (or sub-work field, SWF) can be scanned. The overall image is assembled, when necessary, from a maximum of 30*30 micro-fields, whose centerpoints are moved to with the macro-deflection system. The individual pixel values can be averaged with swpACC by repeating the entire micro-field each time. Scanning can be performed only with a square beam format. Input is always made using swpfm; the orthogonal format swpfmo is automatically set to that value.

Registers and functions for acquiring, storing, and processing two-dimensional image data Name of ZBA picture data file (ZPD): pctr_name <S80: no extension>

Size of pixel image in X and Y ($\mu m$): pctr_dim <G: 3, ..., 1700>

Number of pixels in X and Y: pctr_anz <G: 30, ..., 600>

Call: glkmes "picture file" [GLK_FCT]

Input: pctr_name, swpfm, pctr_dim, pctr_anz, swpACC

Output: uln, pctr_name, pctr_dim, pctr_anz, usn, swpfmo, rststep, rstline, SIC_cadr, SIC_RAM, SIC_crtyp With this function, two-dimensional pixel images can be acquired at the current stage position of the alignment detector (swpadw="JU4" or "JU5") or, in summing mode, on any desired object (swpadw="SUM") and stored as a ZBA picture data file (ZPD) in the ZBA31$CalProt: directory under the name pctr_name.ZPD. This is followed automatically by visualization of the image, together with a comment output of the principal image and sweep parameters. The measured images are always square, and are acquired symmetrically with respect to the stage position. The number of image points in the X and Y directions is defined with pctr_anz, the size of the image (in $\mu m$) with pctr_dim, and the beam format to be used with swpfm (swpfmo=swpfm). Averaging of the pixel values of a scanned micro-field can be defined, as in the case of a micro-sweep, with swpACC (swpACC=$2^n$, n=0, ..., 7; i.e. swpACC=1, ..., 128).

Using the selected pctr_dim and pctr_anz parameters, the program automatically calculates the necessary step size in the X and Y directions (swpstep=rststep), the sweep length in the X direction required within a micro-field (swplen), the number of scan lines of a micro-field offset in each case in the negative Y direction (rstline), and the number of micro-fields needed to assemble the overall image (SWF). In contrast to normal sweeps, in image acquisition any desired step sizes (integral multiples of 20 nm) up to a maximum step size of 5 $\mu m$ are permitted, and a low spot number of at least 9 spots per scan line is also allowed. Some of the resulting values are indicated in the SCM as output parameters of the glkmes function, and are shown in the display in the comment block or the log outputs. The last three output parameters indicate the address and RAM type of the stored data of a micro-field in the DSP SIC (program development test parameters).

When selecting the number of image points (pctr_anz), it should be noted that for fewer than 120 pixels, only evennumbered values are permitted (i.e. 30, 32, 34, ... 120), and for values from 120 to 600, only integral multiples of 10 can be used (i.e. 120, 130, 140, ... , 590, 600).

The appearance of the comment block of a ZPD file for an error-free measured value acquisition is as follows (shown as an example):
all 144 SWF measurements successful
S: swptakt 51, swplen 50000 nm, swpstep 1000 nm, GAIN 472
Swp: fm/fmo 720 720, sadw SUM, 0×23 0×70101, O/ILS 2170 624
Pctr: pctr_dim 600 mim, rststep 1000 nm, 50 lines per SWF
Pctr: 360000 pixel, 12*12 SWFs, 2500 (2550) pixels per SWF
Pctr: min/max 88/124 [49/124?], 600*600 pixels, ACC 4, w 51

Based on the image size of 600 $\mu$m (pctr_dim) and a stipulation of 600*600 values, a raster step size of 1 $\mu$m was determined (swpstep=rststep=1000 nm). The overall image, with a total of 360,000 pixels, is made up of 12*12 micro-fields (SWFs). The sweep length within a field is 50 $\mu$m (swplen=50,000 nm), organized into 51 sweep spots in the X direction (swptakt) and 50 scan lines in the Y direction (rstline). The first value of each scan line is ignored when the pixel values are stored, yielding a total of 2,500 values per micro-field (SWF). In this example, the readings were acquired with a format of 720*720 nm$^2$ (swpfm=swpfmo) in summing mode (swpadw="SUM") with SAB parameters saGAIN=472, saOLS=2170, and saILS=624. The sweep control words were set to sactrl=0×23 and swpctrl=0×70101. Averaging was performed with swpACC=4, and the wait time for the individual spots was set at swpwait=51. The minimum of all stored pixel values was 88, the maximum 124.

For programming reasons, the reading should be acquired with a higher swpwait (approx. 40 to 60) than for a normal sweep, so that excessive fluctuations in pixel values are not seen especially at the micro-field joins. This is generally organized automatically within glkmes. If the value is less than 5, the system operates with swpwait=51. The default value of swpwait was previously 2, and is set automatically at kost_ini.

During the acquisition of two-dimensional images, no control is applied to the gain (saGAIN) or offset (saOLS, saILS) of the measurement signal. If the measurement is made with swpadw="JU4" or "JU5", i.e. on the alignment detector, then the system operates with the currently set values for saGAIN, saOLS, and saILS. These are, as a rule, already set to optimum values as a result of the previous sweep positioning operations. It is advantageous to operate, in that context, with the same square sweep format as for later image acquisition.

If the measurement is made on an arbitrary object in summing mode with swpadw="SUM", it is important to ensure beforehand that there exists in the DISK$ZBA31_K:[GS.SWP] directory a CMP file named GLK_PCTR.CMP in which the parameters saREK, saSAL and saSBL have been correctly adjusted either manually or with the DCL command file SA_PAR.COM. These values are then used, as a function of the sweep format used and the currently set beam current, to calculate the settings for saGAIN, saOLS, saILS and sactrl. Certain considerations must be kept in mind in this context:

Loading of the CMP file and calculation of various parameters can be suppressed with a bit mask of 40,000 in the SCM register testconf.

The determination as to whether the file GLK_PCTR.CMP is loaded and evaluated depends on the value of swpadw (SCM register) currently set prior to the call. If the swpadw register is also contained in GLK_PCTR.CMP, then the summing mode (SUM) must also be located there as a register value.

If the CMP file contains the registers swpfm and swpfmo (which are entered there by, for example, SA_PAR), their values should then conform to the desired square format of the acquired image. The value of swpfmo is immaterial; for the subsequent image acquisition the identity swpfmo=swpfm will be set. The format values in the CMP file take precedence over the input parameter swpfm selected in the SCM. The same is true for swpACC.

Since an actual CMP curve is not required for two-dimensional image acquisition, and the file GLK_PCTR.CMP is used only to load the sweep parameters, the actual values of a CMP curve can be almost entirely dispensed with. For programming reasons, after the #compare_values identification the file GLK_PCTR.CMP must contain exactly one arbitrary value (e.g. a 0). Error messages referring to too few CMP values are then suppressed, and no loading occurs into the DSP SIC. The same is true for all CMP files that are selected by way of the GDF file.

If the registers saREK, saSAL or saSBL are not present in the particular CMP files, an error message will result and image acquisition will be terminated.

The first output parameter uln used in glkmes always contains the total number of measured pixel values (pctr_anz$^2$), or a 0 if the image acquisition was not performed due to errors in preparing for the measurement (parameter checking, loading CMP file, etc.). For programming reasons, it, together with the file name pctr_name, comes first to ensure that visualization on the control computer occurs only after image acquisition has been accomplished.

For testing purpose, the possibility exists of making the boundaries of the micro-fields (SWFs) visible in the image data. This is done by setting the register usn (which is not directly part of the glkmes input parameters) to a value of 17. The last value of each scan line and the entire last scan line of the micro-field are then set to a constant value, resulting in a clearly visible linear raster on the display. At the end, the value of usn is set to 1, i.e. activation of the SWF lines is effective only once each time.

Call: pctr_lcmp "load compare picture" [GLK_FCT]
Input: pctr_name
Output: usn, uln, rststep This function is used to load a ZBA picture data file (ZPD file in ZBA31$CalProt directory) previously stored with glkmes as a reference image for the search for a salient mark that can be performed using pctr_test (see next function call). Only data files with a maximum of 120*120 values (pctr_anz) can be used as a reference image. The image that is loaded is not displayed; only the essential image acquisition parameters are output in the log and taken as output parameters. The pctr_dim for the reference image is shown in usn, and its pctr_anz in uln; the resulting step size of the image is additionally output in rststep (=swpstep).

Call: pctr_test "test function" [GLK_FCT]
Input: pctr_name, string, swpfm, pctr_dim, pctr_anz, swpACC
Output: uln, pctr_name, rststep, rstline, swpfmo, string, pctr_dim, pctr_anz, swpx, swpy, dx, dy, swpFC Using pctr_test, the process of searching for a salient mark structure within a search image larger than the reference image, used as part of global alignment, can also be tested independently of a completely executed GDF_ glocos. A prerequisite is that a suitable reference image must first have been loaded using pctr_lcmp. Image evaluation can be performed with a previously stored search image (string="load") or with a search image of the same step size to be acquired afresh (string="auto"; !="load" corresponds to "auto"). When a previously stored image is loaded, the input parameters swpfm, pctr_dim, pctr_anz, and swpACC are overwritten with the values from the ZPD file. If a new search image is to be acquired, these parameters have the same meaning as in the glkmes function also used internally. Within pctr_test, only images with at least 120*120 pixels (pctr_anz) can be acquired. Lower values in the pctr_anz register are automatically set to 120.

Before the actual image analysis begins, the system checks that a suitable reference image has previously been loaded, and that the raster step size of the reference image is identical to that of the search image. The image analysis algorithm requires observance of certain boundary conditions that are summarized separately in a later section.

As the result of an error-free image search, the offset of the center of the reference image with respect to the center of the search image (in nm) is entered into registers dx and dy, and a quality indicator for the reliability of the result is reported in swpFC. The higher the quality indicator (in any case greater than 1.1), the greater the likelihood that the search for the reference structure within the search image is unique. In test evaluations with real wafer images, this value was generally between 5 and 20; even lower values (greater than 1.3) yielded satisfactory results.

Regardless of whether the image was loaded or measured afresh, the search image is visualized upon completion just as in the case of the glkmes function described above.

Call: oldmes "micro or macro" [GLK_FCT]
Input: pctr_name, string, radx, stepx, fx, fy
Output: uln, pctr_name, string, radx, stepx, stab_min, stab_max This is a test function with which uln readings resulting from individual measurement with the function sadw_mes are transferred via the signal channel in accordance with the selection in swpadw, stored in a ZPD file, and displayed.

Beam deflection can be performed selectably with the micro-deflection system (string="micro") or macro-deflection system (string="macro"). As in the case of cenmes, the size of the image is defined by the parameters radx and stepx (5 # radx #299) (both also apply in the Y direction). The number of image points in the X and Y directions is ((2*radx)+1). Image acquisition always occurs symmetrically with respect to the current stage position, and the image center corresponds to the undeflected beam, i.e. mx=my=hx=hy=0. When selecting the step size, note that (radx*stepx) must not exceed the boundaries of the selected deflection system (mx, my and hx, hy).

The gain setting saGAIN and offsets saILS and saOLS must be (incrementally) adapted manually to the beam format of fx*fy that is used. Because each measurement position is moved to individually, the measurement time can be very long especially when the macro-deflection system is selected. One should therefore begin with a low value (radx=5) and slowly move up to the desired image size. The minimum and maximum of all measured A/D converter values (corresponding to sadw_val) is transmitted in the two output parameters stab_min and stab_max.

Call: tafswp "test 2D sweep" [SWEEP_FCT]
Input: swpx, swpy, swplen, swpstep, rstline, rststep, pctr_name
Output: uln, swperr, swpMIN, swpMAX, swpMH, swplen, swpstep,
swptakt, SIC_cadr, SIC_RAM, SIC_crtyp The tafswp function is used to test the measurement function for two-dimensional scanning of a micro-field. All the necessary step sizes, the sweep length for definition of the pixel count in the X direction, and the number of raster lines in the negative Y direction, must be provided as input parameters. The tafswp function can be called only with swpdir=0 and a bit mask 4 set in testconf. The testconf value prevents automatic adaptation of swplen and swpstep to normal default sweep values, and allows the definition of any desired sweep step sizes as integral multiples of 5 nm. After the tafswp function has been called, the bit mask 4 must always be deleted again, since it suppresses the automatic adaptation of swplen and swpstep that is expected by many SEQ and DCL command files.

The sweep output values swpMIN, swpMAX and swpMH correspond to the values transferred from the DSP SIC. The parameters SIC_cadr, SIC_RAM and SIC_crtyp make it possible to read out the uln=(rstline*swptakt) unsigned pixel readings (8 bits) stored in the DSP SIC using the function store_cbl, and store them as an ASCII table under the fixed file name STORE_CBLOCK_nnn.DAT in the ZBA31$CALPROT: directory.

Setting the input parameter pctr_name to "tafswp" causes the (rstline*swptakt) pixel values to be automatically read out of the DSP SIC, stored as a ZBA picture data file TAFSWP.ZPD in the ZBA31$CALPROT: directory, and then graphically displayed.

Visualizing stored ZBA picture data files (ZPD files):

If the VISUREM.EXE program is present in the ZBA31$SYSTEM: directory, it is possible to visualize previously stored ZPD files at a later point in time in the same way as after the SCM call of the glkmes function. This requires the following steps within any DecTerm window of the control computer:

1. Define a symbol, usually REM, as follows (required only once):
   CAL>REM==,, $ZBA31$SYTEM:VISUREM"
2. Start the VISUREM using the symbol REM, indicating the complete ZPD file specification:
   CAL>REM ZBA31$CALPROT:WAFER_TEST.ZPD In similar fashion, the REMTOBMP.EXE program, also in the ZBA31$SYSTEM: directory, can be used to convert stored ZPD data files into a BMP format suitable for further processing on a PC; or, with the REMTOASC.EXE file, a text file (ASCII format) of the stored binary data can be generated. The procedure is as follows:

CAL>RTB==,, $ZBA31$SYSTEM:REMTOBMP"
CAL>RTA==,, $ZBA31$SYSTEM:REMTOASC"
CAL>RTB ZBA31$CALPROT:WAFER_TEST.ZPD
CAL>RTA ZBA31$CALPROT:WAFER_TEST.ZPD

The BMP file WAFER_TEST.BMP no longer contains a comment block, which is stored concurrently in a text file WAFER_TEST.BXT. The entire comment block is transferred into the listing file WAFER_TEST.LIS, beginning with an exclamation point (!) on each line. The pixel values are entered into pctr_anz lines of pctr_anz columns each. Output is decimal, with three fixed digits and a space as separating character. As a result, lines of more than 256 characters per line can be created as soon as pctr_anz exceeds 62; this must be kept in mind when selecting a suitable editor.

Enhancements within the global alignment description file (GDF)

The incorporation of two-dimensional image analysis into the overall global alignment procedure (GDF_glocos and beam_glk functions) necessitated an enhancement of existing GDF file input capabilities. The list of possible capture marks was expanded to include the PICTURE mark type, which can be used in the following three modifications:

| PICTURE   | position-X | position-Y | n |     |
|-----------|------------|------------|---|-----|
| P_PICTURE | position-X | position-Y | n | and |
| F_PICTURE | position-X | position-Y | n. |    |

As previously, this mark type requires two position indications (in μm) with reference to the center of the search images to be acquired (real values with max. two places after the decimal), and input in this case of only one number (n, integer value) of the file name to be used (cmp_namen). The size of the respective search image and the quantity of pixel data are defined with the following registers also used in the GDF file:

pctr_dim integer value ! image size in μm in X and Y directions; and pctr_anz integer value ! number of image points in X and Y directions.

Both registers can be redefined again for each acquired image that is used. To allow a decision as to whether or not the acquired search images are to be stored as a ZPD data file, a further register used only in the GDF file:

store_mod yes ! yes or no possible (default: no)
was added. The search images are stored by the glkmes function in the ZBA31$CALPROT: directory, under the name cmp_namen_measuring.ZPD.

No prepositioning was performed on the existing capture mark types labeled with the "F_" prefix. Since image analysis is always performed with the entire acquired image, there is no difference here between PICTURE and F_PICTURE. The measurement results of the image marks beginning with the prefix "P_" (P_PICTURE) are, as before, not included in the stage transformation calculation performed at the end.

The new GDF file capabilities can be combined with the existing capture marks that are suitable for sweep measurements. One typical application is to use the image analysis function for coarse prepositioning, especially on marks that, because of their surroundings, do not allow a coarse search with sweep positioning operations. A fine positioning can then be performed on existing mark types using the sweep measurements usual in that context.

The image analysis process is based on the search for a salient structure (reference image) within a large search image that is to be acquired afresh. The functions glkmes, pctr_lcmp, and pctr_test, already discussed above, are used for this purpose. The procedure requires first loading a CMP file to define the sweep parameters used during image acquisition, and loading a reference image, to be prepared beforehand, containing the centeredly positioned mark structure. Selection of the file names necessary for this purpose is accomplished via the third parameter n (see above) of a PICTURE mark, which requires that the register have been defined previously, for example with the name test_picture, in the following form:

cmp_namen test_picture

In this case a file named TEST_PICTURE.CMP, containing the sweep parameters swpfm (swpfmo=swpfm), swpACC, saREK, saSAL, saSBL and swpadw="SUM" necessary for image acquisition, must exist in the DISK$ZBA31_K:[GS.SWP]: directory; and a reference image named TEST_PICTURE.ZPD (acquired with glkmes) must be stored in the ZBA31$CALPROT: directory.

It is important to ensure that the step size used when acquiring the reference image is identical to the step size (defined by pctr_dim and pctr_anz) of the search image.

A more detailed utilization explanation will be provided below with reference to a concrete example. Since the position correction accuracy depends on the step size defined by the parameters pctr_dim and pctr_anz, in the example the two positions are each used twice, but the second time with a finer step size and a smaller image dimension. This means that in every case a matching second reference image must also exist; this will also be explained in the example. The coarse calibration and rotation correction that is performed right after the second PICTURE mark and used for further positioning operations is sufficient for measuring the CROSS mark contained in the reference structure with additional conventional sweeps. The corrections thereby obtained are used to determine the stage transformation:

! GDF pattern with 2D image analysis and subsequent sweep measurements

```
#cmp_name      cross              ! for F_CROSS
#cmp_name3     picture_coarse! for P_PICTURE ...x ...y 3
#cmp_name5     picture_fine       ! for P_PICTURE ...x ...y 5
#init_mod      yes                ! Begin glk_init
#cmvtx         850.00             ! Start offset X in μm
#cmvty         -1100.00           ! Start offset Y in μm
! New picture parameter
#store_mod     yes                ! Store picture_coarse_measuring.ZPD
                                  ! and picture_fine_measuring.ZPD
#pctr_dim      720                ! Search image 720 μm
#pctr_anz      600                ! 600*600 pixels, step 1200 nm
#P_PICTURE     0  32000.00   3    ! Reference image: picture_coarse.ZPD
#P_PICTURE     0 -32000.00   3    ! S parameter: picture_coarse.CMP
!
! Repeat with finer step size
#pctr_dim      150                ! Search image 150 μm
#pctr_anz      300                ! 300*300 pixels, step 500 nm
#P_PICTURE     0 -32000.00   5    ! Reference image: picture_fine.ZPD
#P_PICTURE     0  32000.00   5    ! S parameter: picture_fine.CMP
! Begin sweep measurements
#cmradx        40.00              ! 40 μm, ->sweep pre-deflection 20 μm
#cmrady        40.00
#F_CROSS       0  32000.00   0    ! CMP curve: cross.cmp
#F_CROSS       0 -32000.00
!
! --- end of --- MUSTER_PICTURE.GDF --- !
```

The reference image PICTURE_COARSE.ZPD used for the first two image evaluations must be acquired with a step size of 1.2 μm and, given the size (600*600 image points) of the search image, should if possible be the maximum size (120) of a reference image (e.g. pctr_anz=120, pctr_dim=144). The second reference image PICTURE_FINE.ZPD, with a step size of 500 nm, can be acquired, for example, using pctr_dim=40 and pctr_anz=80. The two CMP files PICTURE_COARSE.CMP and PICTURE_FINE.CMP can be identical, but for programming reasons must exist under exactly those names. What is most important is that the respective associated reference images be acquired with the same sweep parameters swpfm, saREK, saSAL, and saSBL, so that the contrast conditions do not differ greatly from those of the acquired search images.

The algorithm is used to search for a salient mark, i.e. a uniquely recognizable two-dimensional image structure, within a search image that is larger than the reference structure. It imposes certain criteria regarding the appearance of the mark:

- the mark being searched for must be unique, i.e. no identical structures, and if possible no similar ones, must exist in the vicinity;
- the mark must be distinctive in planar terms, i.e. the mark must still be recognizable as such even if the image is reduced to one-third size in the X and Y directions;
- the reference and search images should possess good a signal-to-noise ratio, and exhibit approximately the same contrast;
- the mark should comprise several homogeneous areas with an extension of at least 10*10 pixels; this component should constitute 25% of the total area;
- the ratio between reference image and search image should be between 1:2 and a maximum of 1:5 in one coordinate direction (corresponds to the pctr_anz ratio).

Figure 5:
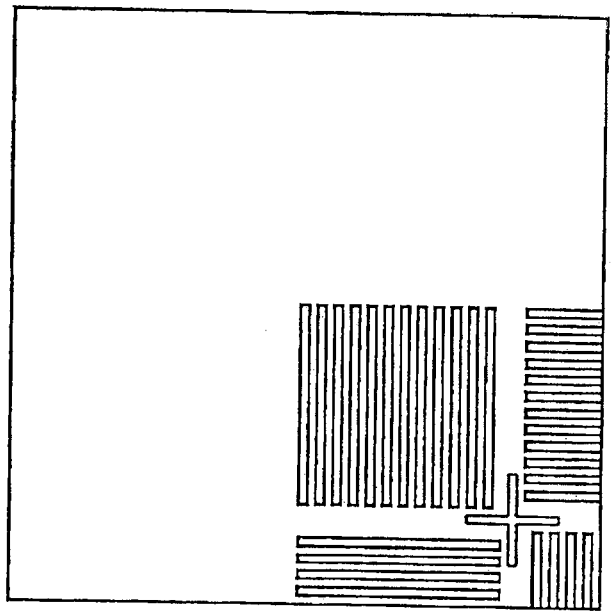
FIG. 5 shows an example of a search image.

Depicted at this juncture as an example is a reference mark 120 μm in size, with a pixel count of 120*120 values (step size 1000 nm), which was used to test the image analysis function used to search in the 600*600 pixel image that is also depicted:

Reference image (pctr_anz=120, pctr_dim=120, swpfm=swpfmo=720, min=90, max=125) see FIG. 2;

Search image (pctr_anz=600, pctr_dim=600, swpfm=swpfmo=720, min=87, max=123) see FIG. 5.

What is claimed is:

1. A method for exposing a layout comprising multiple layers on a wafer, comprising:

photolithographically exposing at least one layer that contains selected structural features;

aligning the wafer coarsely with respect to an electron beam exposure system in such a way that a surface area of the previously photolithographically exposed layer is located in a deflection region of the electron beam;

scanning the surface area in the X and Y direction in spot fashion with the electron beam and thereby exposing at least one further layer with the electron beam of the electron beam exposure system;

detecting radiation backscattered from individual spots;

obtaining, from the intensities of the radiation backscattered from the individual spots, an actual data set that corresponds to a raster image of that surface area with the wafer in the actual position;

comparing the actual data set to a stored reference data set that corresponds to the raster image (template) of the same surface area with the wafer in the reference position;

deriving information from the deviation between the two data sets, as to the deviation between the actual position and the reference position;

causing, on the basis of that information, a positional change of the wafer in order to bring the actual position closer to the reference position; and obtaining an actual data set and comparing it to the reference data set until no further deviation is ascertained.

2. The method as defined in claim 1, in which the reference data set is obtained with a wafer that has already been exposed, the wafer and the electron beam exposure system first being displaced relative to one another until the selected structural features are located in the reference position, and a data set corresponding to the raster image of the surface area having those structural features then being acquired and stored.

3. The method as defined in claim 1, in which the reference data set is taken from a structure data set of the layer that is to be exposed photolithographically, and stored.

4. The method as defined in claim 1, in which the surface area having the selected structural features that is scanned in spot fashion in the X and Y directions has a size in the range up to 2000 μm×2000 μm.

5. The method as defined in claim 1 in which the actual data set that corresponds to a raster image of the surface area having the selected structural features is obtained from the radiation backscattered from between 20×20 and 1000×1000 spots.

6. The method as defined in claim 1, wherein during scanning of the surface area with the electron beam in spot fashion, a step size from spot to spot lies in the range from 20 nm to 5 μm.

7. The method as defined in claim 1, wherein during scanning in spot fashion, the surface area is divided into micro-fields that are scanned individually and sequentially and, for purposes of analysis, assembled into an overall image.

8. The method as defined in claim 1, in which after agreement has been achieved between the actual data set and the reference data set, a fine alignment of the wafer is performed on the basis of alignment marks present on the wafer.

9. A computer readable storage medium containing computer code for accomplishment of the method of claim 1.

* * * * *